(12) United States Patent
Fujii et al.

(10) Patent No.: US 7,327,209 B2
(45) Date of Patent: Feb. 5, 2008

(54) PIEZOELECTRIC THIN FILM RESONATOR

(75) Inventors: Hidetoshi Fujii, Ishikawa-ken (JP); Ryuichi Kubo, Ishikawa-ken (JP); Hajime Yamada, Otsu (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 11/715,359

(22) Filed: Mar. 8, 2007

(65) Prior Publication Data

US 2007/0152775 A1 Jul. 5, 2007

Related U.S. Application Data

(63) Continuation of application No. PCT/JP2005/008427, filed on May 9, 2005.

(30) Foreign Application Priority Data

Sep. 10, 2004 (JP) .............................. 2004-264281

(51) Int. Cl.
*H03H 9/15* (2006.01)
*H03H 9/54* (2006.01)
*H03H 9/70* (2006.01)

(52) U.S. Cl. .................... 333/187; 333/189; 333/133

(58) Field of Classification Search ................ 333/187, 333/189, 133
See application file for complete search history.

(56) References Cited

U.S. PATENT DOCUMENTS 4,642,508 A * 2/1987 Suzuki et al. ............... 310/321

2003/0001689 A1 * 1/2003 Takeuchi et al. ............ 333/133
2003/0141946 A1   7/2003 Ruby et al.
2005/0179508 A1 * 8/2005 Sato ........................... 333/187

FOREIGN PATENT DOCUMENTS

| JP | 61-127216 | 6/1986 |
| JP | 61-127217 | 6/1986 |
| JP | 61-218214 | 9/1986 |
| JP | 61-218215 | 9/1986 |
| JP | 62-94008  | 4/1987 |
| JP | 62-200813 | 9/1987 |
| JP | 63-305608 | 12/1988 |
| JP | 1-73782   | 3/1989 |

(Continued)

OTHER PUBLICATIONS

English language abstract for Yanonouchi JP 63-305608 (cited by Applicants), published Dec. 13, 1988.*

(Continued)

*Primary Examiner*—Barbara Summons
(74) *Attorney, Agent, or Firm*—Dickstein, Shapiro, LLP.

(57) ABSTRACT

A piezoelectric thin film resonator that ensures the strength of a membrane without degrading the resonant properties and which can be easily handled in mounting. The piezoelectric thin film resonator has a substrate, a thin film member, and reinforcing films. The thin film member has at least two support portions supported by the substrate and a floating portion disposed over the substrate with a space provided therebetween and supported by the support portions. The floating portion includes a pair of excitation electrodes facing each other and a piezoelectric thin film provided therebetween. The reinforcing films are formed in the vicinities of the boundaries between the floating portion and the support portions of the thin film member.

18 Claims, 7 Drawing Sheets

FOREIGN PATENT DOCUMENTS

| | | |
|---|---|---|
| JP | 4-18806 | 1/1992 |
| JP | 6-40611 | 5/1994 |
| JP | 06-204776 | 7/1994 |
| JP | 08-078995 | 3/1996 |
| JP | 08-078997 | 3/1996 |
| JP | 10-200369 | 7/1998 |
| JP | 11-205062 | 7/1999 |
| JP | 2001-168674 | 6/2001 |
| JP | 2002-009355 | 1/2002 |
| JP | 2002-073879 | 2/2002 |
| JP | 2002-198758 | 7/2002 |
| JP | 2003-017973 | 1/2003 |
| JP | 2003-283292 | 3/2003 |
| JP | 2003-163566 | 6/2003 |
| JP | 2004-072715 | 3/2004 |
| JP | 2004-120219 | 4/2004 |
| JP | 2005-033262 | 2/2005 |

OTHER PUBLICATIONS

Written Opinion from corresponding International application dated Aug. 30, 2005.

* cited by examiner

PIEZOELECTRIC THIN FILM RESONATOR

CROSS REFERENCE TO RELATED APPLICATIONS

The present application is a continuation of International Application No. PCT/JP2005/008427, filed May 9, 2005, which claims priority to Japanese Patent Application No. JP2004-264281, filed, Sep. 10, 2004, the entire contents of each of these applications being incorporated herein by reference in their entirety.

FIELD OF THE INVENTION

The present invention relates to a piezoelectric thin film resonator.

BACKGROUND OF THE INVENTION

In a piezoelectric thin film resonator, a vibration part composed of a pair of excitation electrodes facing each other and a piezoelectric thin film provided therebetween must be acoustically separated from a substrate. Accordingly, some type of piezoelectric thin film resonator is formed so that a thin film member (membrane) partly floats over the substrate with an airspace layer provided therebetween.

In a piezoelectric thin film resonator having this type of structure, the thin film member includes support portions supported by the substrate and a floating portion floating over the substrate, the floating portion is supported by the support portions, a stress is liable to be concentrated on the vicinity of each boundary between the floating portion and the support portion, and as a result, cracking is liable to occur. In addition, a vibration part of the floating portion is liable to warp. Hence, the structure has been proposed in which a piezoelectric thin film is provided between a pair of excitation electrodes and is then further sandwiched with a pair of dielectric thin films (for example, see Patent Document 1: Japanese Unexamined Patent Application Publication No. 6-40611).

In the case in which a piezoelectric thin film is provided between a pair of excitation electrodes and is then further sandwiched with a pair of dielectric thin films, although cracking and warping of a vibration part can be suppressed, the vibration mode must be a harmonic vibration mode such as a third harmonic vibration mode, and as a result, the bandwidth of the resonant properties is decreased compared to that of a fundamental wave resonator. When this resonator is used, the filter bandwidth is also decreased, and hence a desired filter cannot be formed.

In addition, in a dicing step, because of insufficient strength of the vibration part, diaphragm damage is liable to occur. Furthermore, when the resonator is handled in mounting, since the vibration part is not covered for protection, a load is easily applied thereto, and hence elemental defects caused by damage are liable to be generated.

SUMMARY OF THE INVENTION

The present invention has been conceived in consideration of the above circumstances, and an object of the present invention is to provide a piezoelectric thin film resonator which can ensure the strength of a membrane without degrading the resonant properties and which can be easily handled in mounting.

In order to achieve the above object, the present invention provides a piezoelectric thin film resonator having the following structure.

The piezoelectric thin film resonator has a substrate, a thin film member, and reinforcing films. The thin film member has at least two support portions supported by the substrate and a floating portion disposed over the substrate with an airspace layer provided therebetween and supported by the support portions. The floating portion includes a vibration part composed of a pair of excitation electrodes and a piezoelectric thin film provided therebetween. The reinforcing films are formed in the vicinities of the boundaries between the floating portion and the support portions of the thin film member.

According to the structure described above, in the vicinities of the boundaries between the floating portion and the support portions of the thin film member (membrane), the strength of the membrane is increased by the reinforcing films, and cracking and warping is reduced.

In addition, since the reinforcing films are not formed at the vibration part of the thin film member, the resonant properties are not degraded.

Furthermore, since the reinforcing films are provided around the vibration part, the vibration part is located at a lower side with respect to the reinforcing films, and a load is not likely to be applied to the vibration part; hence, handling in mounting can be easily performed.

In addition, the present invention provides a piezoelectric thin film resonator having the following structure.

The piezoelectric thin film resonator has a substrate, a thin film member, reinforcing films, and an inter-resonator reinforcing film. The thin film has at least three support portions supported by the substrate and a floating portion disposed over the substrate with an airspace layer provided therebetween and supported by the support portions. The floating portion includes at least two vibration parts each composed of a pair of excitation electrodes and a piezoelectric thin film provided therebetween. The vibration parts are aligned in a direction between two of the support portions. The reinforcing films are formed in the vicinities of the boundaries between the floating portion and the two support portions of the thin film member. The inter-resonator reinforcing film is disposed from another support portion of the thin film member so as to be extended between the two vibration parts of the floating portion of the thin film member.

According to the above structure, cracking and warping of the membrane having a plurality of vibration parts can be reduced.

In addition, since the reinforcing films are not formed at the vibration parts of the thin film member, the resonant properties are not degraded.

Furthermore, since the reinforcing films are provided around the vibration parts, the vibration parts are located at a lower side with respect to the reinforcing films, and a load is not likely to be applied to the vibration parts; hence, handling in mounting can be easily performed.

The substrate preferably has a flat portion and tapered portions. The support portions of the thin film member are in contact with the flat portion and the tapered portions of the substrate in the vicinities of the boundaries with the floating portion. The taper angle of the floating portion in the vicinity of the boundary is smaller than the taper angle of the tapered portion of the substrate.

According to the above structure, since the floating portion is approximately continuously extended from the surface at which the thin film member and the substrate are in contact with each other, stress concentration in the vicinity of the boundary between the support portion and the floating portion of the thin film member is reduced, and hence cracking and warping can be reduced.

In the piezoelectric thin film resonators having the above structures, the boundary between the support portion and the floating portion of the thin film member preferably forms a straight line.

According to the above structure, the area of the floating portion can be decreased, and the size of the piezoelectric thin film resonator can be reduced.

In the piezoelectric thin film resonators having the above structures, the boundary between the support portion and the floating portion of the thin film member preferably forms a curved line.

According to the above structure, the rigidity of the boundary between the support portion and the floating portion of the thin film member can be increased, and cracking and warping can be reduced.

The substrate is preferably an r-plane sapphire. The piezoelectric thin film is made of ZnO or AlN.

The substrate is preferably a c-plane sapphire, a z-plane LiTaO$_3$, or a z-plane LiNbO$_3$. The piezoelectric thin film is made of ZnO or AlN.

In this case, at a resonant frequency of 1.5 GHz or more, the effect of the reinforcing film is significant.

In addition, the present invention provides a piezoelectric filter using a piezoelectric thin film resonator having one of the structures described above. By using a piezoelectric thin film resonator which ensures the strength of the membrane without degrading the resonant properties, the piezoelectric filter has high reliability and desired resonant properties.

In addition, the present invention provides a duplexer using a piezoelectric thin film resonator having one of the above structures or a piezoelectric filter having one of the above structures. By using the piezoelectric thin film resonator which ensures the strength of the membrane without degrading the resonant properties, or by using the piezoelectric filter which uses the above piezoelectric thin film resonator, the duplexer has high reliability and desired frequency properties.

In addition, the present invention provides a communication apparatus using a piezoelectric thin film resonator having one of the above structures or a piezoelectric filter having one of the above structures. By using the piezoelectric thin film resonator which ensures the strength of the membrane without degrading the resonant properties, or by using the piezoelectric filter which uses the above piezoelectric thin film resonator, the communication apparatus has high reliability and desired frequency properties.

The piezoelectric thin film resonator according to the present invention can ensure the strength of the membrane without degrading the resonant properties and can be easily handled in mounting.

REFERENCE NUMERALS

Figure 1:
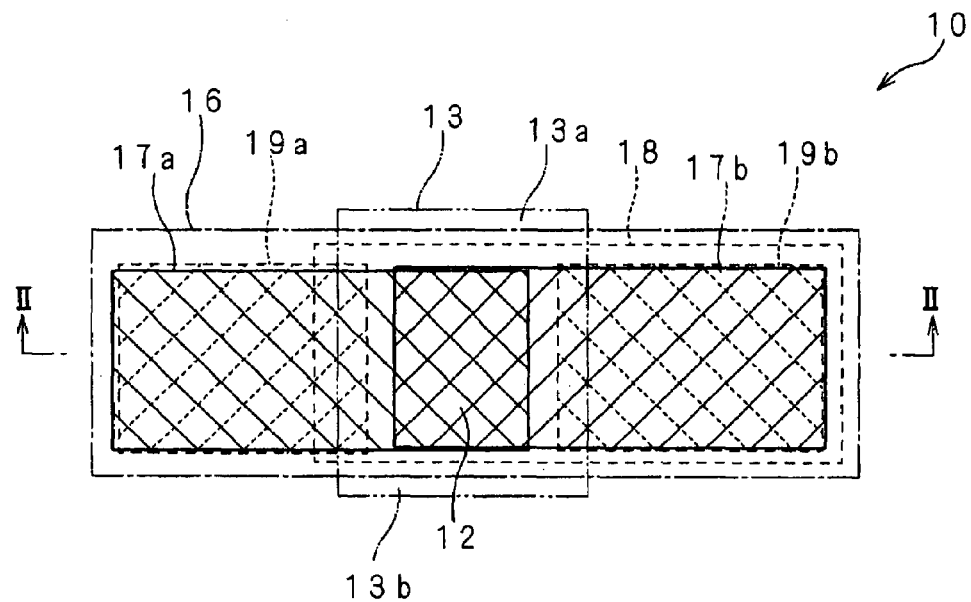
FIG. 1 is a plan view of a portion of a piezoelectric thin film resonator of the present invention (Example 1).

10 piezoelectric thin film resonator
11 substrate
14 airspace layer
17a, 17b electrode (excitation electrode)
18 piezoelectric thin film
19a, 19b reinforcing film
27a, 27b electrode (excitation electrode)
28 piezoelectric thin film
29a, 29b reinforcing film
30 piezoelectric thin film resonator
31 substrate
34 airspace layer
37a, 37b electrode (excitation electrode)
38 piezoelectric thin film
39a, 39b reinforcing film
42s, 42t vibration part
47a, 47b, 47c electrode (excitation electrode)
48 piezoelectric thin film
49a, 49b, 49c, 49d reinforcing film
49s reinforcing film (inter-resonator reinforcing film)
50 piezoelectric thin film resonator
51 substrate
51a upper surface (flat portion)
51s inclined surface (tapered portion)
54 airspace layer
57a, 57b electrode (excitation electrode)
58 piezoelectric thin film
59a, 59b reinforcing film
63s, 63t edge (boundary)
67a, 67b electrode (excitation electrode)
68 piezoelectric thin film
69a, 69b reinforcing film
70 piezoelectric filter
80 duplexer
90 communication apparatus

DETAILED DESCRIPTION OF THE INVENTION

Hereinafter, examples will be described as embodiments according to the present invention with reference to FIGS. 1 to 12.

EXAMPLE 1

Figure 2:
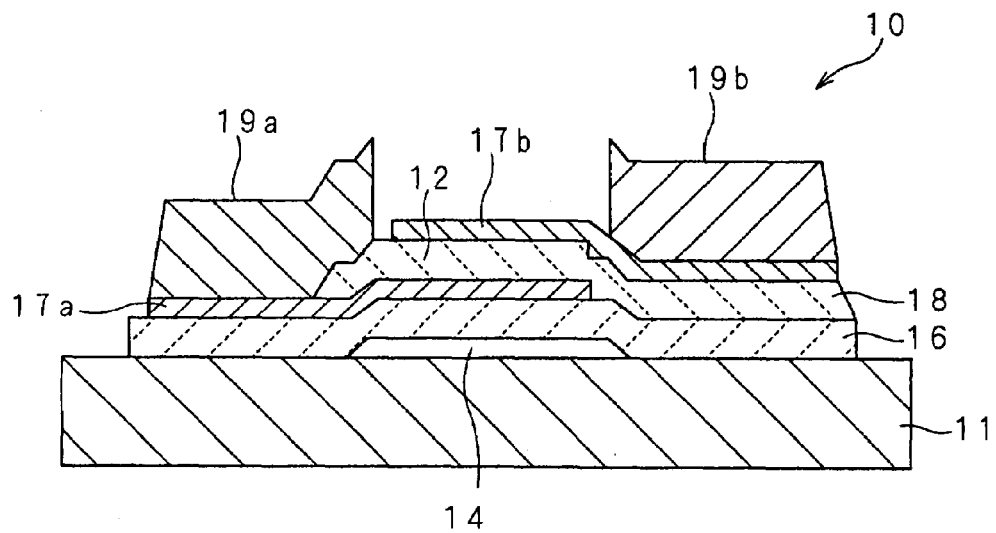
FIG. 2 is a cross-sectional view taken along the line II-II shown in FIG. 1 (Example 1).

FIG. 1 is a plan view schematically showing an important portion of the structure of a piezoelectric thin film resonator 10 according to Example 1. FIG. 2 is a cross-sectional view cut along the line II-II in FIG. 1.

The piezoelectric thin film resonator 10 has the structure that a dielectric film 16, a lower electrode 17a, a piezoelectric thin film 18, an upper electrode 17b, and reinforcing films 19a and 19b are formed on a substrate 11. Since an airspace layer 14 (see FIG. 2) formed by removing a sacrifice layer 13 (see FIG. 1) present between the substrate 11 and the dielectric film 16, a vibration part 12 has a structure which floats over the substrate 11. The vibration part 12 is formed by the dielectric film 16, the electrodes 17a and 17b overlapped with each other in lamination direction, and the piezoelectric thin film 18 between the lower electrode 17a and the upper electrode 17b.

The piezoelectric thin film resonator 10 is formed as described below.

The sacrifice layer 13 is formed on part of the substrate 11 by techniques, such as sputtering and etching. The sacrifice layer 13 is made of a material, such as zinc oxide, which is likely to be chemically dissolved a substrate which is inexpensive and which has superior machinability is used for the substrate 11. A Si or a glass substrate having a flat surface is more preferable. The sacrifice layer 13 is finally removed in order to form the airspace layer 14. As a material for the sacrifice layer 13, a material is preferably used which can withstand the high temperature generated when the piezoelectric thin film 18 is formed and which can be easily removed. For example, a metal such as Ge, Sb, Ti, Al, or Cu, a phosphorous silicate glass (PSG), or a polymer may be used. As the polymer, for example, polytetrafluoroethylene or its derivative, poly(phenylene sulfide), poly(ether ether ketone), polyamide, poly(amide imide), polyimide, poly (imide siloxane), vinyl ether, polyphenyl, parylene-n, parylene-f, or benzocyclobutene may be preferable. The thickness of the sacrifice layer 13 to be formed must have a thickness so that the vibration part 12 is not brought into contact with the substrate 11 even when the membrane is warped, and for easy fabrication. The thickness is preferably in the range of 50 nm to several micrometers.

Next, a dielectric film (not shown) is formed by sputtering, CVD, electron beam deposition, or the like to cover the entire surfaces of the sacrifice layer 13 and the substrate 11. As the dielectric film (not shown), a material having a temperature coefficient of frequency (TCF) opposite to that of a material forming the piezoelectric thin film 18 is used. Accordingly, when a frequency change with respect to a temperature change of a resonator or a filter decreases, the properties are improved. Preferably, zinc oxide or aluminum nitride is used for the piezoelectric thin film 18, $SiO_2$, which has a TCF opposite to that of the above-described piezoelectric thin film material.

Next, on the dielectric film (not shown), the lower electrode 17a is formed by film formation using sputtering, CVD, electron beam deposition, or the like and by patterning using a photolithographic technique. The lower electrode 17a is primarily formed using a metal material, such as Mo, Pt, Al, Au, Cu, or Ti, and formed so as to be a belt shape provided on the sacrifice layer 13 and the substrate 11.

Next, the piezoelectric thin film 18 is formed using zinc oxide, aluminum nitride or the like on the lower electrode 17a by film formation using sputtering or the like and patterning using a photolithographic technique. When aluminum nitride is formed, aluminum nitride is patterned by lift-off using zinc oxide. Since the dielectric film 16 of $SiO_2$ or the like is formed over the entire surface of the sacrifice layer 13, even when zinc oxide used for lift-off is wet-etched when the zinc oxide used for lift-off is patterned or when aluminum nitride is processed by lift-off, zinc oxide used for forming the sacrifice layer 13 is not etched.

Next, the upper electrode 17b is formed on the piezoelectric thin film 18 in a similar way as that of the lower electrode 17a.

Next, the reinforcing films 19a and 19b are formed. As shown in FIG. 1, when the lower electrode 17a and the upper electrode 17b are linearly disposed, the reinforcing films 19a and 19b are formed on the lower electrode 17a and the upper electrode 17b located at connection portions between the membrane and the substrate 11. The connection portions are the vicinities of the boundaries between the floating portion of the membrane and the support portions; hereinafter, the connection portions will be used in the same way as described above. Furthermore, the reinforcing films 19a and 19b are formed on parts of the electrodes 17a and 17b, which do not form the vibration part 12, as much as possible. A formation method of the reinforcing films 19a and 19b is sputtering, CVD, electron beam deposition, or the like. As a material for the reinforcing films 19a and 19b is a metal (including an alloy) material containing at least one element selected from the group consisting of Al, Ag, Au, Co, Cr, Cu, Fe, In, Mo, Nb, Ni, Ti, Pd, Pt, W, Zr, and the like.

Next, sacrifice-layer etching holes 13a and 13b and the dielectric film 16 are formed. The sacrifice-layer etching holes 13a and 13b are parts of the sacrifice layer 13, which are not covered with the dielectric film 16. The dielectric film (not shown) on the sacrifice etching holes 13a and 13b are removed by patterning of a photoresist or the like using a photolithographic technique, followed by doing reactive ion etching, wet etching, or the like. For example, when $SiO_2$ is used for the dielectric film (not shown), reactive ion etching is performed using a fluorinated gas such as $CF_4$. Alternatively, wet etching may be performed using a hydrofluoric acid solution. After the etching, an etching mask such as a photoresist is removed by an organic solvent such as acetone.

Next, the sacrifice layer 13 is etched through the sacrifice-layer etching holes 13a and 13b, so that the airspace layer 14 is formed. By patterning a photoresist or the like using a photolithographic technique, and the sacrifice layer 13 is removed by reactive ion etching or wet etching. For example, when zinc oxide is used for forming the sacrifice layer 13, it is removed using an acidic solution containing hydrochloric acid, phosphoric acid, or the like. After the etching, an etching mask such as a photoresist is removed using an organic solvent such as acetone. When a solution, which does not etch the piezoelectric thin film 18, the dielectric film 16, the electrodes 17a and 17b, and the reinforcing films 19a and 19b, is used, a process including patterning by photolithography and removal of the etching mask thereof can be omitted. For example, when aluminum nitride is used for the piezoelectric thin film 18, $SiO_2$ is used for the dielectric film 16, and Pt, Au, Ti, or the like is used for the electrodes 17a and 17b, zinc oxide forming the sacrifice layer 13 can be removed by a mixed aqueous solution composed, for example, of acetic acid and phosphoric acid without patterning. After the etching, replacement using a volatile solution such as IPA (isopropyl alcohol) is sufficiently performed, followed by drying, so that the airspace layer 14 is formed.

In the case in which zinc oxide is used both for the sacrifice layer 13 for forming the airspace layer and a lift-off mask for forming the piezoelectric thin film 18 using aluminum nitride, since the dielectric film 16 is formed over the entire surface of the sacrifice layer 13 when aluminum nitride is patterned, the shape of the sacrifice layer 13 is not damaged when the aluminum nitride is processed by lift-off. When structural films other than the sacrifice layer 13 have resistance against an etching solution for the sacrifice layer 13, a patterning step necessary for sacrifice-layer etching can be omitted, and as a result, because of process stabilization and decrease in number of steps, the cost can be reduced. After the sacrifice layer 13 is wet-etched, when the etchant is sufficiently replaced with a volatile solution such as IPA, time required for a drying step performed after the removal of the sacrifice layer can be decreased, and hence the cost can be reduced.

In the piezoelectric thin film resonator 10, since the reinforcing films 19a and 19b made of a metal are formed at the connection portions between the membrane and the substrate, on which a stress of the membrane is concentrated after the sacrifice layer 13 is removed, the strength of the membrane is increased, and characteristic defects caused by cracking and warping of the membrane can be reduced. In addition, since the reinforcing films 19a and 19b made of a metal are formed on the lower electrode 17a and the upper electrode 17b, the wiring resistance is decreased, and the insertion loss of a filter is decreased; hence, superior filter characteristics can be obtained. In addition, when the reinforcing films 19a and 19b are formed using a metal having high thermal conductivity, the heat dissipation characteristics are further improved, and a resonator having more superior resistance against electric power can be obtained.

Figure 3:
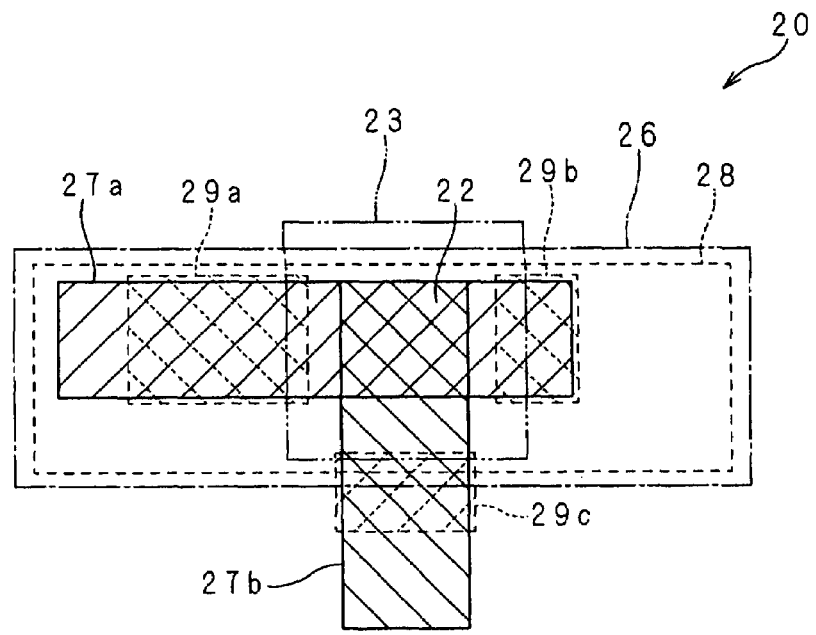
FIG. 3 is a plan view of a portion of a piezoelectric thin film resonator of a modified example of the present invention.

In FIG. 3, as a modification of Example 1, the case in which the lower electrode 27a and the upper electrode 27b are not linearly disposed is shown. A dielectric film 26, a lower electrode 27a, a piezoelectric thin film 28, an upper electrode 27b, and reinforcing films 29a, 29b and 29c are formed on the substrate. The lower electrode 27a is formed so as to stride over a sacrifice layer 23, connection portions between the membrane and the substrate are provided at two sides of a vibration part 22, and the reinforcing films 29a and 29b are formed on the lower electrode 27a located at these two connection portions. The upper electrode 27b is disposed on the sacrifice layer 23 perpendicular to the lower electrode 27a so that at least one end of the upper electrode 27b is extended to the substrate from the sacrifice layer 23. The reinforcing film 29c is formed on the upper electrode 27b located at least one connection portion between the membrane and the substrate.

EXAMPLE 2

Figure 4:
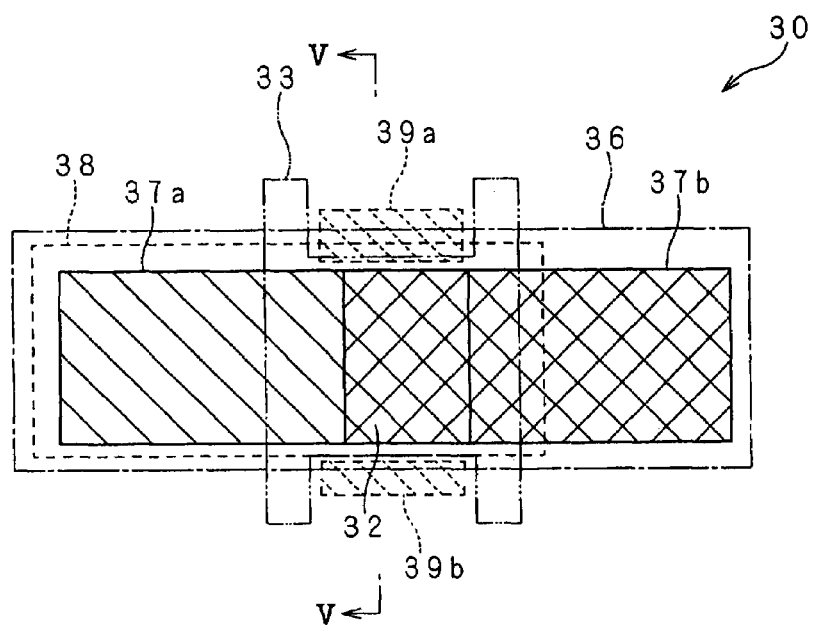
FIG. 4 is a plan view of a portion of a piezoelectric thin film resonator of the present invention (Example 2).
Figure 5:
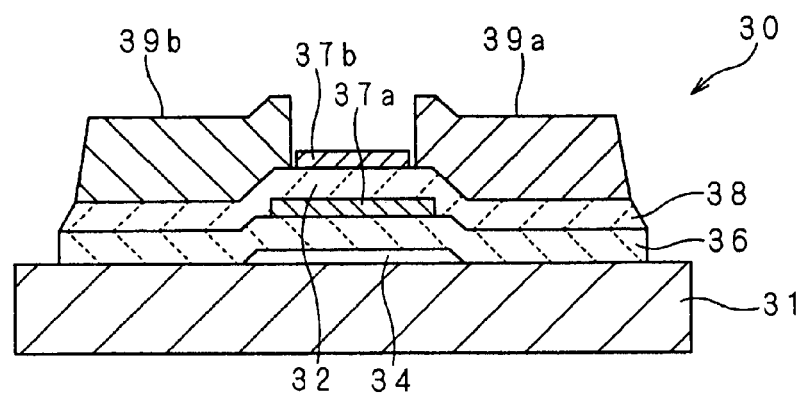
FIG. 5 is a cross-sectional view taken along the line V-V shown in FIG. 4 (Example 2).

FIG. 4 is a plan view schematically showing an important portion of the structure of a piezoelectric thin film resonator 30 according to Example 2. FIG. 5 is a cross-sectional view cut along the line V-V in FIG. 4.

The piezoelectric thin film resonator 30 has the structure, which is approximately equivalent to that in Example 1, in which a dielectric film 36, a lower electrode 37a, a piezoelectric thin film 38, an upper electrode 37b, and reinforcing films 39a and 39b are formed on a substrate 31. By the presence of an airspace layer 34 formed between the substrate 31 and the dielectric film 36, it is a structure in which a vibration part 32 floats over the substrate 31. The vibration part 32 is formed by a region 32 in which the electrodes 37a and 37b are overlapped with each other in the laminating direction and the vibration part 32 being composed of parts of the dielectric film 36, the lower electrode 37a, the piezoelectric thin film 38 and the upper electrode 37b.

However, a particular structure of the membrane is different from that of the membrane in Example 1. That is, the sacrifice layer 33 is formed to have an approximately H shape as shown in FIG. 4, and connection portions between the membrane and the substrate 31 are provided at four places. The reinforcing films 39a and 39b are provided at two places which are adjacent to the vibration part 32 and which are not on the lower electrode 37a and the upper electrode 37b. A method for manufacturing the reinforcing films 39a and 39b is sputtering, CVD, electron beam deposition, or the like. A material for the reinforcing films 39a and 39b is an insulating material primarily composed of silicon oxide, silicon nitride, alumina, aluminum nitride, titanium oxide, tantalum oxide, or the like, and a multilayer structure having at least two layers may also be formed.

In Example 1, the reinforcing films 19a and 19b must be disposed so as not to cause electrical shortage between the lower electrode 17a and the upper electrode 17b and so as not to make parasitic capacitance between the electrodes 17a and 17b cause any adverse influence on the resonant properties. However, as is the case of Example 2, when the reinforcing films 39a and 39b are formed of an insulating material, since it is not required to consider electrical wiring of the resonator, the degrees of freedom of layout of the reinforcing materials can be increased. When the reinforcing films 39a and 39b are formed to have a multilayer structure composed of at least two types of insulating materials, the stress of the reinforcing films 39a and 39b can be reduced, and hence the strength of the membrane is improved. As the reinforcing films 39a and 39b, when aluminum nitride, which has excellent thermal conductivity, is used, the heat dissipation characteristics are improved, and as a result, a resonator having superior resistance against electric power can be obtained.

In the piezoelectric thin film resonator 30, since the reinforcing films 39a and 39b are formed at the connection portions between the membrane and the substrate, on which a stress is concentrated after the sacrifice layer 33 is removed, the strength of the membrane is increased, and characteristics defects caused by cracking and warping of the membrane can be reduced, as is the case in Example 1.

Besides the reinforcing films 39a and 39b disposed at the connection portions between the membrane and the substrate, which are located in regions in which the electrodes 37a and 37b are not formed, reinforcing films made of a metal material and/or multilayer reinforcing films made of a metal material and an insulating material may be disposed on the lower electrode 37a and the upper electrode 37b located at connection portions between the membrane and the substrate, as is the case in Example 1.

EXAMPLE 3

Figure 6:
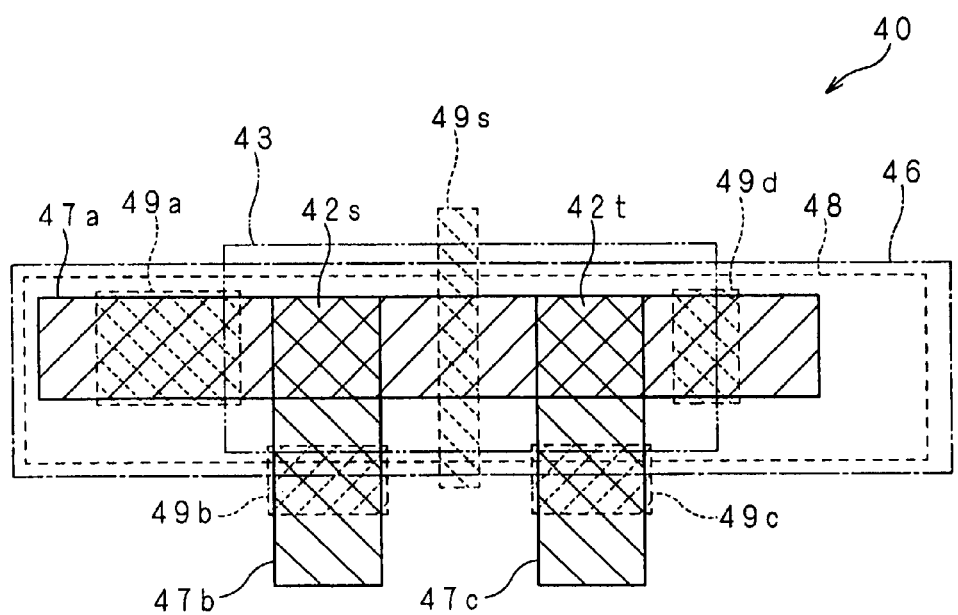
FIG. 6 is a plan view of a portion of a piezoelectric thin film resonator of the present invention (Example 3).

FIG. 6 is a plan view schematically showing an important portion of the structure of a piezoelectric thin film resonator 40 according to Example 3.

The piezoelectric thin film resonator 40 has the structure which is approximately equivalent to that in Example 1; however, different from Example 1, two resonator elements are provided. That is, a dielectric film 46, a lower electrode 47a, a piezoelectric thin film 48, an upper electrode 47b and 47c, and reinforcing films 49a, 49b, 49c, 49d, and 49s are formed on a substrate. By the presence of an airspace layer formed by a sacrifice layer 43 provided between the substrate and the dielectric film 46, it is a structure that vibration parts 42s and 42t float over the substrate, the vibration parts 42s and 42t are formed by the dielectric film 46 in regions 42s and 42t that the lower electrode 47a is overlapped with the upper electrodes 47b and 47c and the piezoelectric thin film 48 in the laminating direction. The reinforcing films 49a, 49b, 49c, and 49d are formed on the lower electrode 47a and the upper electrodes 47b and 47c located at the connection portions between the membrane and the substrate. The reinforcing film 49s is formed so as to traverse over the sacrifice layer 43 in a region other than the vibration parts 42s and 42t.

In the piezoelectric thin film resonator 40, since the reinforcing films 49a, 49b, 49c, 49d, and 49s are formed at the connection portions between the membrane and the substrate, on which a stress is concentrated after the sacrifice layer 43 is removed, the strength of the membrane is increased, and property defects caused by cracking and warping of the membrane can be reduced, as is the case in Example 1.

EXAMPLE 4

Figure 7:
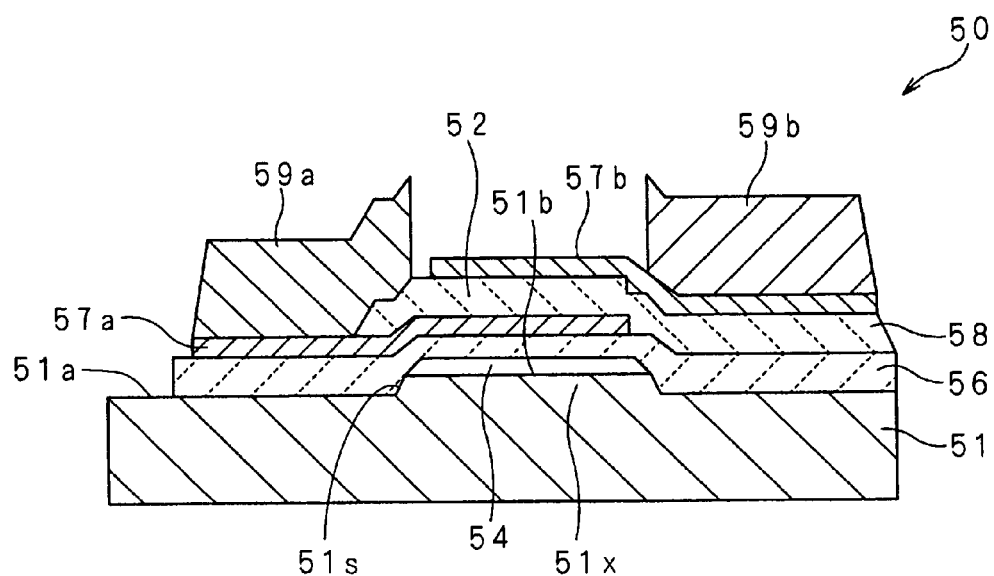
FIG. 7 is a cross-sectional view of a piezoelectric thin film resonator of the present invention (Example 4).
Figure 8:
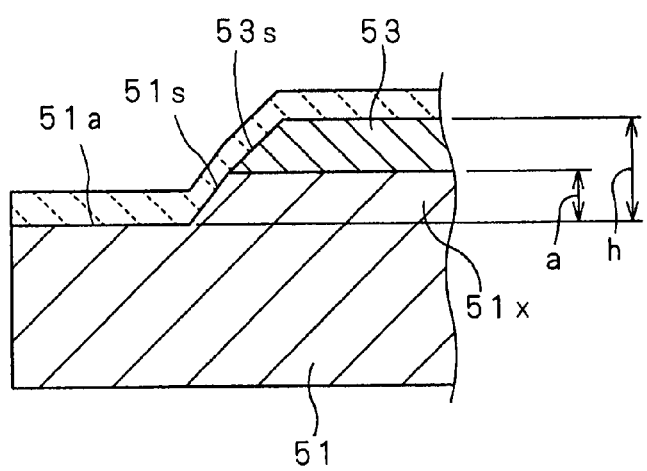
FIG. 8 is a cross-sectional view of a portion of the piezoelectric thin film resonator of the present invention (Example 4).

FIG. 7 is a cross-sectional view schematically showing the structure of a piezoelectric thin film resonator 50 according to Example 4. FIG. 8 is an enlarged cross-sectional view of an important portion shown in FIG. 7.

In the piezoelectric thin film resonator 50 according to Example 4, an airspace layer 54 is formed on a protruding portion 51x formed on an upper surface 51a of a substrate 51. A dielectric film 56, a lower electrode 57a, a piezoelectric thin film 58, an upper electrode 57b, and reinforcing films 59a and 59b, form a thin film member. The airspace layer 54 is formed on the piezoelectric thin film resonator 50. The upper surface 51a of the substrate 51 and an inclined surface 51s of the protruding portion 51x form a forward tapered shape. That is, an angle formed between the upper surface 51a of the substrate 51 and the inclined surface 51s of the protruding portion 51x is an obtuse angle (more than 90° and less than 180°). The thin film member and the substrate 51 are in contact with each other via the two surfaces 51a and 53s intersecting each other at an obtuse angle.

The piezoelectric thin film resonator 50 is formed as described below.

A sacrifice layer 53 having a thickness larger than that to be finally obtained is formed at a place at which the protruding portion 51x of the substrate 51 is formed. This sacrifice layer 53 is patterned so that the cross-section of the sacrifice layer 53 has a trapezoidal shape, and the slope thereof is preferably formed to have a moderate forward tapered shape (forming an obtuse angle of close to 180° with the upper surface of the substrate 51) with respect to the substrate 51. In order to obtain a moderate forward tapered shape of the cross-section of the sacrifice layer 53, for example, when a photoresist is used as the sacrifice layer 53, patterning is performed using a grey tone mask, and light intensity thereof is gradually changed so that the slope is formed to have a forward tapered shape.

Next, the sacrifice layer 53 and the substrate 51 are etched by reactive ion etching or wet etching. For example, by performing reactive ion etching using a fluorinated gas such as $CF_4$, Si and/or $SiO_2$ of the substrate 51 and a polymer used for the sacrifice layer 53 are both etched. At this stage, when the etching rate of the substrate 51 is larger than that of the sacrifice layer 53, the slope of the inclined surface 53s of the sacrifice layer 53 is smaller than that of the inclined surface 51s of the protruding portion 51x, as shown in FIG. 8. That is, when substrate etching is performed using the sacrifice layer 53 having a trapezoidal cross-sectional shape as a mask, the sacrifice layer 53 is etched in the thickness direction as the substrate 51 is etched in the thickness direction, and a substrate area covered with the sacrifice layer is decreased; hence, as a result, a taper having a larger angle is formed on the substrate 51 than that formed on the sacrifice layer 53.

As the taper angel of the inclined surface 53s of the sacrifice layer 53 is smaller than that of the inclined surface 51s of the protruding portion 51x of the substrate 51, a residual stress of the membrane can be reduced, and hence the strength thereof can be ensured. In addition, the dielectric film 56 can be formed over the sacrifice layer 53 with good coatability. In addition, the electrodes 57a and 57b formed in a subsequent step can also be formed with good coatability, and element defects caused, for example, by breakage of the electrodes 57a and 57b, can be reduced.

After the protruding portion 51x is formed on the substrate 51, the sacrifice layer 53 must have a thickness so that even when the membrane is warped, a vibration part 52 and the substrate 51 (an upper surface 51b of the protruding portion 51x) are not brought into contact with each other, and for easy formation, the thickness is preferably in the range of 50 nm to ten and several micrometers.

In addition, for easy formation, as shown in FIG. 8, a height a of the protruding portion 51x formed on the substrate 51 is preferably 50 nm or less and is more preferably not less than the thickness of the membrane. Furthermore, the height a shown in FIG. 8 is preferably approximately half of h shown in the same figure.

As shown in FIG. 8, the inclined surface 53s of the sacrifice layer 53 is more inclined than the inclined surface 51s of the protruding portion 51x formed on the substrate 51, and the change in angle of the membrane is decreased as small as possible (the angle is gradually changed).

In the piezoelectric thin film resonator 50, as the taper angle of the sacrifice layer 53 is smaller than that of the substrate 51, the strength of the membrane can be ensured, and characteristics defects caused by cracking and warping of the membrane can be reduced. In addition, as the taper angle of the sacrifice layer 53 is smaller than that of the protruding portion 51x of the substrate 51, the electrodes 57a and 57b formed in a subsequent step can be formed with good coatability, and as a result, element defects caused, for example, by breakage of the electrodes 57a and 57b can be reduced. Even after the sacrifice layer 53 is removed, the strength of the membrane can be ensured.

EXAMPLE 5

A piezoelectric thin film resonator having the structure similar to that in Example 4 can be formed by a method different from that described above.

That is, after a sacrifice layer is formed on a substrate, an etching mask is formed on the sacrifice layer. Subsequently, the sacrifice layer and the substrate are etched by reactive ion etching or wet etching to form tapers on the sacrifice layer and the substrate. Subsequently, the etching mask is removed. Besides a photoresist or the like, a metal such as Al may be used as the etching mask. The step of etching the sacrifice layer and the substrate may be performed together with the etching mask removal step. That is, in the etching step, the sacrifice layer, the substrate, and the etching mask are all etched, and etching is continued until at least the etching mask is removed.

Compared to the case in which after the sacrifice layer is patterned, the protruding portion is formed on the substrate, and the sacrifice layer is simultaneously etched, as that in Example 4, since the number of steps performed for the sacrifice layer is small, the process stability can be obtained.

EXAMPLE 6

In a piezoelectric thin film resonator according to Example 6, the dielectric film is not used for the membrane, and the floating portion is only formed of electrodes and a piezoelectric thin film provided therebetween.

That is, before a sacrifice layer is formed on a substrate, at least one structural film, such as a dielectric film, a metal film, or an organic film, is formed. When Si is used for the substrate, thermal oxidized silicon may be formed. Alternatively, by sputtering, CVD, electron beam deposition, or the like, a dielectric film of silicon nitride or the like may also be formed.

Since the structural film is formed between the electrode and the substrate, diffusion of the structural film between the electrode and the substrate can be prevented, a problem of degradation in insulating resistance between the electrodes caused by the diffusion can be solved.

EXAMPLE 7

Figure 9:
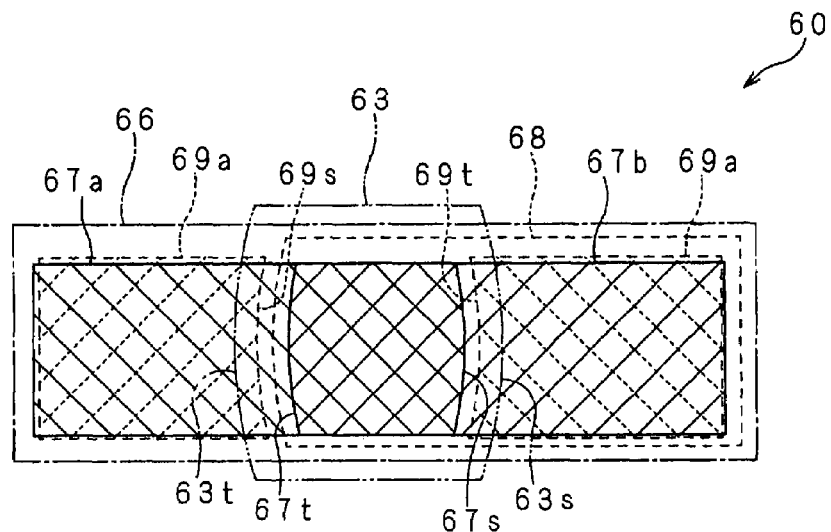
FIG. 9 is a plan view of a portion of a piezoelectric thin film resonator of the present invention (Example 7).

FIG. 9 is a plan view schematically showing an important portion of the structure of a piezoelectric thin film 60 according to Example 7.

In a manner approximately similar to that of the other examples, after a sacrifice layer 63 for forming an airspace layer is formed on a substrate, a dielectric film 66, a lower electrode 67a, a piezoelectric thin film 68, an upper electrode 67b, and reinforcing films 69a and 69b are formed on the sacrifice layer 63.

However, different from the other examples, edges 63s and 63t of the sacrifice layer 63 are curved lines, and after the sacrifice layer 63 is removed, the shape of the boundary of a support portion supported by the substrate and a floating portion of a membrane floating over the substrate is a curved line. In addition, the shapes of end portions 67s and 67t of the electrodes 67a and 67b, which form a vibration part 62 in the membrane, are curved lines, and the shapes of the edges 63s and 63t of the sacrifice layer 63, which is adjacent to the electrodes 67a and 67b, are set approximately parallel to the shapes of the end portions 67s and 67t of the electrodes 67a and 67b, respectively.

In the piezoelectric thin film resonator 60 according to Example 7, since the shape in the vicinity of the boundary between the floating portion and the support portion of the membrane, on which a stress is concentrated after the sacrifice layer 63 is removed, is formed to have a moderately curved line, the strength of the membrane is increased, and property defects caused by cracking and warping of the membrane can be reduced. In addition, when the shapes of the end portions 67s and 67t of the electrodes 67a and 67b, which form the vibration part 62 in the membrane, are curved lines, and when the shapes of the edges 63s and 63t of the sacrifice layer 63 adjacent to the electrodes 67a and 67b are set approximately parallel to the shapes of the end portions 67s and 67t of the electrodes 67a and 67b, respectively, heat generated in the vibration part 62 can be efficiently dissipated to the substrate, and as a result, a resonator having more excellent resistance against electric power can be obtained.

EXAMPLE 8

A piezoelectric thin film resonator having a structure similar to that of the above examples can be formed by forming a sacrifice layer primarily composed of ZnO on a sapphire substrate having a c-plane on the surface thereof. At this stage, the c-plane of the ZnO forming the sacrifice layer is in a direction along the normal to a substrate surface. On this sacrifice layer, a lower electrode composed of Al, Au, Cu, Ir, Mo, Ni, Pd, Pt, Ta, or W, which has good lattice conformity with ZnO, is formed. On the lower electrode, a piezoelectric thin film composed of ZnO, AlN, $BaTiO_3$, $KNbO_3$, PZT, or the like, which has good lattice conformity with the lower electrode, is formed. At this stage, the c-plane of the piezoelectric thin film if formed in a direction along the normal to the substrate surface. In addition, on the piezoelectric thin film, an upper electrode composed of Al, Au, Cu, Ir, Mo, Ni, Pd, Pt, Ta, or W, which has good lattice conformity with the piezoelectric thin film, is formed. A method for forming the sacrifice layer, the lower electrode, the dielectric film, or the upper electrode is, for example, sputtering, CVD, or electron beam deposition. As a patterning method, for example, lift-off or etching may be used. Subsequently, the sacrifice layer is removed by wet etching, dry etching, or the like. For the substrate, besides the sapphire substrate, a SiC substrate having an a-plane on the surface thereof or $LiTaO_3$ or $LiNbO_3$ having a z-plane on the surface thereof may also be used. In addition, $SiO_2$ or the like having a sign of temperature coefficient of elastic constant different from that of the piezoelectric thin film may be used in combination. As the vibration mode, a thickness longitudinal vibration mode is used.

EXAMPLE 9

A piezoelectric thin film resonator having the structure shown in FIG. 4 and using a thickness shear vibration mode can be formed by using a sapphire substrate having an r-plane on the surface thereof. ZnO for the sacrifice layer is formed so that a c-plane thereof is in a direction perpendicular to the normal to the substrate surface. Accordingly, the piezoelectric thin film is formed so that a c-plane thereof is in a direction perpendicular to the normal to the substrate surface.

When ZnO or AlN is formed on the r-plane sapphire substrate as a piezoelectric thin film, a piezoelectric thin film having a c-axis parallel to the substrate surface is obtained, and when this film is provided between a pair of electrodes which are parallel to the substrate surface, a thickness shear mode can be excited. Compared to a thickness longitudinal mode BAW resonator, in a thickness shear mode BAW resonator in which the same resonant frequency can be obtained, the thickness of the piezoelectric thin film can be decreased to approximately half. Since it is liable to be damaged, the effect of reinforcing films is more significant. In addition, in order to improve the crystallinity of the piezoelectric thin film, the sacrifice layer on the sapphire substrate and the electrode on the sacrifice layer are both required to be oriented films.

By a c-plane sapphire, a z-plane $LiTaO_3$, or a z-plane $LiNbO_3$, ZnO or AlN is formed on the substrate, a piezoelectric thin film having a c-axis perpendicular to the substrate surface is obtained, and when this film is provided between a pair of electrodes which are parallel to the substrate surface, a thickness longitudinal mode can be excited. Even in the thickness longitudinal mode, since the thickness is decreased inversely proportional to the resonant frequency, damage is liable to occur; hence, in a resonant frequency region of 1.5 GHz or more, the effect of reinforcing films is more significant.

EXAMPLE 10

Figure 10A:
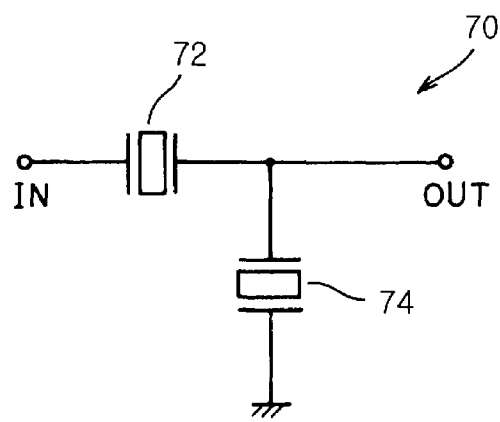
FIG. 10a is a circuit diagram of a ladder filter (Example 10).
Figure 10B:
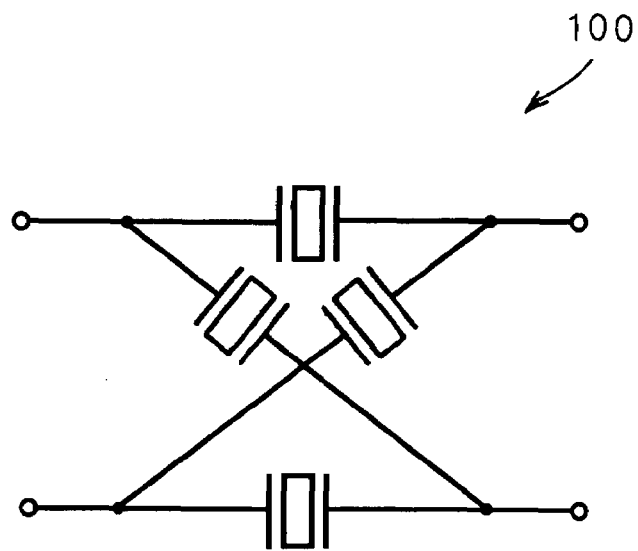
FIG. 10b is a circuit diagram of a lattice type filter (Example 10).
Figure 10C:
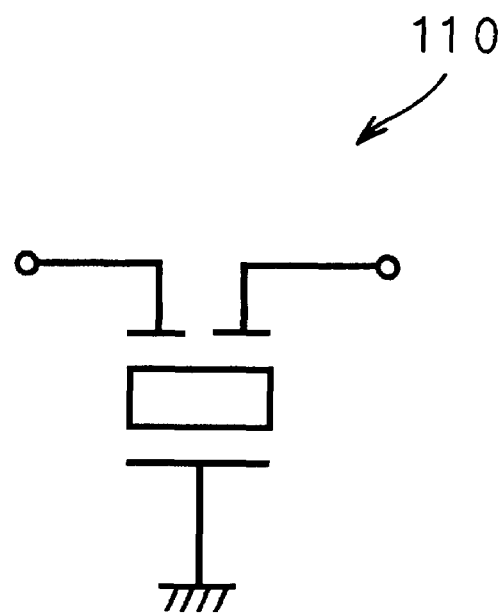
FIG. 10c is a circuit diagram of a multimode type filter (Example 10).

FIGS. 10a to 10c are circuit diagrams of piezoelectric filters according to Example 10.

The piezoelectric filters according to Example 10 are formed using the piezoelectric thin film resonators according to Examples 1 to 9. A piezoelectric filter 70 shown in FIG. 10a is an L type ladder filter formed by ladder connection in an L shape between one series piezoelectric thin film resonator 72 and one parallel piezoelectric thin film resonator 74. A piezoelectric filter 100 is a lattice type filter in which piezoelectric thin film resonators are connected in a lattice shape. In this case, an balance-balance filter can be formed. A piezoelectric filter 110 shown in FIG. 10c is a multiple mode filter. In this case, a filter having a high selectivity can be obtained.

In the above piezoelectric filters 70, 100, and 110, since the piezoelectric thin film resonator is used which can ensure the strength of the membrane without degrading the resonant characteristics, a piezoelectric filter having high reliability and desired frequency properties can be obtained.

EXAMPLE 11

Figure 11:
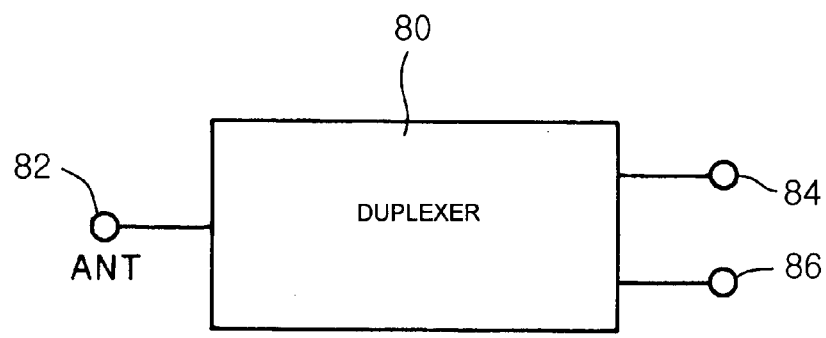
FIG. 11 is a circuit diagram of a duplexer (Example 11).

FIG. 11 is a circuit diagram of a duplexer according to Example 11.

A duplexer 80 is provided with an antenna terminal 82, a receiving terminal 84, and a transmitting terminal 86. The duplexer 80 has a piezoelectric filter, which passes only a receiving frequency band and attenuates a transmitting frequency band, between the receiving terminal 84 and the antenna terminal 82. In addition, the duplexer 80 has a piezoelectric filter, which passes only a transmitting frequency band and attenuates a receiving frequency band, between the transmitting terminal 86 and the antenna terminal 82. The filters of the duplexer 80 are formed using the piezoelectric thin film resonators according to Examples 1 to 9.

Since the piezoelectric filters of the duplexer 80 are formed of piezoelectric thin film resonators which can ensure the strength of the membrane without degrading the resonant properties, the duplexer 80 can be formed to have high reliability and desired frequency properties.

EXAMPLE 12

Figure 12:
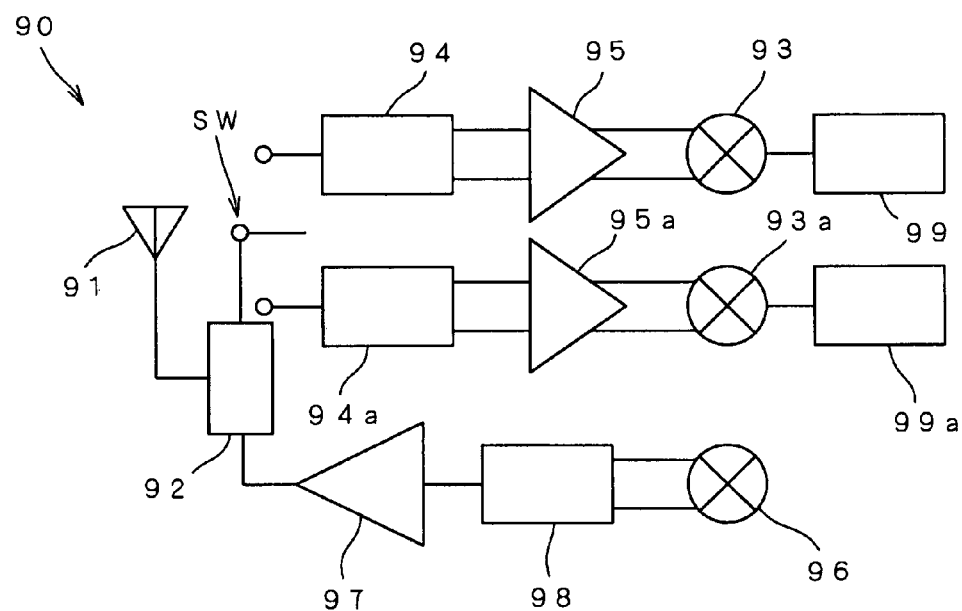
FIG. 12 is a block diagram of a communication apparatus (Example 12).

FIG. 12 is a block diagram showing an important portion of a communication apparatus 90 according to Example 12.

The communication apparatus 90 is formed so as to communicate with a different system such as a multiband mobile phone and so that a receiving frequency can be switched by a switch SW. A duplexer 92 is connected to an antenna 91. Two receiving circuits are connected to the duplexer 92 via the switch SW. That is, between the switch SW and piezoelectric filters 99 and 99a of the IF stage, receiving RF piezoelectric filters 94 and 94a, amplifiers 95 and 95a, and receiving mixers 93 and 93a are connected, respectively. In addition, between the duplexer 92 and a transmitting mixer 96, an amplifier 97 and a receiving piezoelectric filter 98, which form the RF stage, are connected.

In this communication apparatus 90, when piezoelectric filters and a duplexer are used which are formed using piezoelectric thin film resonators that can ensure the strength of a membrane without degrading the resonant characteristics, high reliability and desired frequency properties can be obtained.

A multiband FR filter module for mobile phone is a communication apparatus in which a circuit element at least including the receiving RF piezoelectric filters 94 and 94a is modularized.

As has thus been described with reference to the above examples, the piezoelectric thin film resonators of the examples are resonators each primarily composed of a substrate and a piezoelectric substance provided between electrodes so as to form a sacrifice layer between the substrate and the piezoelectric substance, and reinforcing films are formed at connection portions between the substrate and a membrane.

After the sacrifice layer is removed, the membrane is deformed. At this stage, a stress is concentrated on the connection portions (in the vicinities of the boundaries between the support portions and the floating portion) between the membrane and the substrate. Since the reinforcing films are not formed at the vibration part of the piezoelectric thin film resonator and are only provided in regions on which this stress is concentrated, the strength of the membrane can be ensured without degrading the resonant characteristics.

When reinforcing films made of a metal are used, the heat dissipation properties dissipating heat from the resonator to the substrate are improved, and a resonator having superior resistance against electric power can be obtained.

Since the reinforcing films are provided around the vibration part, the vibration part is dented with respect to the reinforcing films; hence, element defects, which are caused by a load applied to the vibration part in steps such as dicing and mounting, can be reduced. In addition, handling in mounting can be easily performed.

In addition, in a conventional diaphragm type, tapered portions are required for the membrane support substrate, and hence reduction in element size is limited thereby. Accordingly, for reduction in element size, a sacrifice layer type is preferable. In addition, the number of steps for the sacrifice layer type is smaller, and hence the element can be manufactured at a lower cost.

In addition, on the lower electrode and the upper electrode at the connection portions between the membrane and the substrate, metal films are formed as parts of the reinforcing films. Since the reinforcing film can decrease wiring resistance of the piezoelectric thin film resonator, the insertion loss of the filter can be decreased, and hence superior filter properties can be obtained. When a metal having a high thermal conductivity is used, the heat dissipation characteristics are further improved, and as a result, a resonator having more superior resistance against electric power can be obtained.

The thickness of the reinforcing film is preferably in the range of 0.1 to 50 μm for both a metal film and an insulating film, in which patterning can be easily performed. As the thickness of the reinforcing film is increased, the reinforcing effect is enhanced; however, when the thickness is excessively large, the membrane is destroyed by a stress.

The present invention is not limited to the above examples, and various modifications may be performed without departing from the scope of the present invention.

For example, in a manner opposite to that in Example 4, a recess portion may be formed in the substrate. In this case, in the vicinity of the boundary between the support portion and the floating portion of the thin film member, the taper angle of the floating portion is preferably set smaller than that of the recess portion with which the support portion is in contact.

The invention claimed is:

1. A piezoelectric thin film resonator comprising:
   a substrate;
   a dielectric film having at least two support portions supported by the substrate and a floating portion disposed over the substrate with an airspace layer provided therebetween and supported by the support portions;
   a vibration part located on the floating portion, the vibration part comprising a pair of excitation electrodes and a piezoelectric film provided therebetween; and
   reinforcing films formed at locations proximal to boundaries between the floating portion and the support portions of the dielectric film.

2. The piezoelectric thin film resonator according to claim 1,
   wherein the substrate has a flat portion and tapered portions,
   the support portions of the dielectric film are in contact with the flat portion and the tapered portions of the substrate, and
   taper angles of the floating portion in the vicinities of the boundaries between the floating portion and the support portions are smaller than taper angles of the tapered portions of the substrate.

3. The piezoelectric thin film resonator according to claim 1,
   wherein the boundaries between the support portions and the floating portion of the dielectric film each form a straight line.

4. The piezoelectric thin film resonator according to claim 1,
   wherein the boundaries between the support portions and the floating portion of the dielectric film each form a curved line.

5. The piezoelectric thin film resonator according to claim 1,
   wherein the substrate comprises an r-plane sapphire, and the piezoelectric film comprises ZnO or AlN.

6. The piezoelectric thin film resonator according to claim 1,
   wherein the substrate comprises a c-plane sapphire, a z-plane LiTaO$_3$, or a z-plane LiNbO$_3$, and
   the piezoelectric film comprises ZnO or AlN.

7. A piezoelectric thin film filter comprising: the piezoelectric thin film resonator according to claim 1.

8. A duplexer comprising: the piezoelectric thin film resonator according to claim 1.

9. A communication apparatus comprising: the piezoelectric thin film resonator according to claim 1.

10. A piezoelectric thin film resonator comprising:
    a substrate;
    a dielectric film having at least three support portions supported by the substrate and a floating portion disposed over the substrate with an airspace layer provided therebetween and supported by the support portions;
    at least two vibration parts located on the floating portion, each vibration part comprising a pair of excitation electrodes and a piezoelectric film provided therebetween, the at least two vibration parts being aligned in a direction between two of the at least three support portions;
    reinforcing films formed at locations proximal to boundaries between the floating portion and the two of the at least three support portions of the dielectric film; and
    an inter-resonator reinforcing film disposed between the at least two vibration parts of the floating portion.

11. The piezoelectric thin film resonator according to claim 10,
    wherein the substrate has a flat portion and tapered portions,
    the support portions of the dielectric film are in contact with the flat portion and the tapered portions of the substrate, and
    taper angles of the floating portion in the vicinities of the boundaries between the floating portion and the support portions are smaller than taper angles of the tapered portions of the substrate.

12. The piezoelectric thin film resonator according to claim 10,
    wherein the boundaries between the support portions and the floating portion of the dielectric film each form a straight line.

13. The piezoelectric thin film resonator according to claim 10,
    wherein the boundaries between the support portions and the floating portion of the dielectric film each form a curved line.

14. The piezoelectric thin film resonator according to claim 10,
    wherein the substrate comprises an r-plane sapphire, and the piezoelectric film comprises ZnO or AlN.

15. The piezoelectric thin film resonator according to claim 10,
    wherein the substrate comprises a c-plane sapphire, a z-plane LiTaO$_3$, or a z-plane LiNbO$_3$, and
    the piezoelectric film comprises ZnO or AlN.

16. A piezoelectric thin film filter comprising: the piezoelectric thin film resonator according to claim 10.

17. A duplexer comprising: the piezoelectric thin film resonator according to claim 10.

18. A communication apparatus comprising: the piezoelectric thin film resonator according to claim 10.

* * * * *